United States Patent
Shimmura et al.

(10) Patent No.: US 11,862,485 B2
(45) Date of Patent: Jan. 2, 2024

(54) NOZZLE STANDBY DEVICE, LIQUID PROCESSING APPARATUS AND OPERATION METHOD OF LIQUID PROCESSING APPARATUS

(71) Applicant: Tokyo Electron Limited, Tokyo (JP)

(72) Inventors: Satoshi Shimmura, Koshi (JP); Kohei Kawakami, Koshi (JP); Hiroichi Inada, Koshi (JP); Koji Takayanagi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 140 days.

(21) Appl. No.: 17/471,457

(22) Filed: Sep. 10, 2021

(65) Prior Publication Data

US 2022/0084844 A1  Mar. 17, 2022

(30) Foreign Application Priority Data

Sep. 11, 2020 (JP) .................................. 2020-152741

(51) Int. Cl.
*H01L 21/67* (2006.01)
*H01L 21/02* (2006.01)

(52) U.S. Cl.
CPC .. *H01L 21/67051* (2013.01); *H01L 21/02307* (2013.01); *H01L 21/6715* (2013.01)

(58) Field of Classification Search
None
See application file for complete search history.

(56) References Cited

U.S. PATENT DOCUMENTS

| | | | | |
|---|---|---|---|---|
| 3,074,786 | A | * 1/1963 | Duthie | .................... B01F 27/93 |
| | | | | 366/132 |
| 2017/0128962 | A1* | 5/2017 | Kashiyama | ............... B05B 3/02 |
| 2018/0029059 | A1* | 2/2018 | Takahashi | ............... B05C 11/08 |

FOREIGN PATENT DOCUMENTS

| | | | | |
|---|---|---|---|---|
| JP | 2012232298 A | * 11/2012 | ........... B05B 15/555 |
| JP | 2019-079886 A | 5/2019 | |

\* cited by examiner

*Primary Examiner* — Charles Capozzi
(74) *Attorney, Agent, or Firm* — Pearne & Gordon LLP

(57) ABSTRACT

A nozzle standby device configured to allow a nozzle to stand by therein includes a nozzle accommodation unit, having an inner circumferential surface formed to surround a leading end portion of the nozzle, provided with a drain opening facing a discharge opening of the nozzle; and a solvent discharge opening opened within the nozzle accommodation unit. The nozzle accommodation unit has a diameter reducing portion having a first and a second inner circumferential surfaces having different angles with respect to a center line of the nozzle accommodation unit such that an inner diameter of the diameter reducing portion becomes smaller toward the drain opening. An intersection point of two straight lines extending along two opposite portions of the first inner circumferential surface is located above the discharge opening of the nozzle when the leading end portion of the nozzle is placed in the diameter reducing portion.

15 Claims, 9 Drawing Sheets

NOZZLE STANDBY DEVICE, LIQUID PROCESSING APPARATUS AND OPERATION METHOD OF LIQUID PROCESSING APPARATUS

CROSS-REFERENCE TO RELATED APPLICATION

This application claims the benefit of Japanese Patent Application No. 2020-152741 filed on Sep. 11, 2020, the entire disclosure of which is incorporated herein by reference.

TECHNICAL FIELD

The various aspects and embodiments described herein pertain generally to a nozzle standby device, a liquid processing apparatus, and an operation method of the liquid processing apparatus.

BACKGROUND

Patent Document 1 discloses a nozzle standby device in which a nozzle for discharging a processing liquid, which is to be solidified by being dried, stands by to suck a solvent into a leading end portion of the nozzle to form a liquid layer of the solvent therein. This nozzle standby device is equipped with a nozzle accommodation unit which has an inner circumferential surface formed to surround the leading end portion of the nozzle and is provided with a drain opening formed to face a discharge opening of the nozzle; a solvent discharge opening opened within the nozzle accommodation unit and formed to allow the discharged solvent to be guided along the inner circumferential surface of the nozzle accommodation unit to be drained from the drain opening; and a solvent supply configured to supply the solvent to the solvent discharge opening at a first flow rate when forming a liquid layer of the solvent in the leading end portion of the nozzle and supply the solvent at a second flow rate smaller than the first flow rate after the liquid layer of the solvent is formed to close the discharge opening of the nozzle, thus enabling to maintain the discharge opening of the nozzle closed by the solvent.

Patent Document 1: Japanese Patent Laid-open Publication No. 2019-079886

SUMMARY

In one exemplary embodiment, a nozzle standby device configured to allow a nozzle configured to discharge a processing liquid, which is to be solidified by being dried, to stand by therein is provided. The nozzle standby device includes a nozzle accommodation unit, having an inner circumferential surface formed to surround a leading end portion of the nozzle, provided with a drain opening facing a discharge opening of the nozzle; and a solvent discharge opening opened within the nozzle accommodation unit, and formed such that a discharged solvent is guided along the inner circumferential surface of the nozzle accommodation unit to be drained from the drain opening. The nozzle accommodation unit has, in a region above the drain opening where the solvent discharged from the solvent discharge opening falls down as a swirling flow, a diameter reducing portion having a first inner circumferential surface and a second inner circumferential surface as the inner circumferential surface such that an inner diameter of the diameter reducing portion becomes smaller toward the drain opening, the first inner circumferential surface and the second inner circumferential surface having different angles with respect to a center line of the nozzle accommodation unit. An intersection point of two straight lines extending along two opposite portions of the first inner circumferential surface is located, on a cross section cut along the center line of the nozzle accommodation unit to include the center line, above the discharge opening of the nozzle when the leading end portion of the nozzle is placed in the diameter reducing portion.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
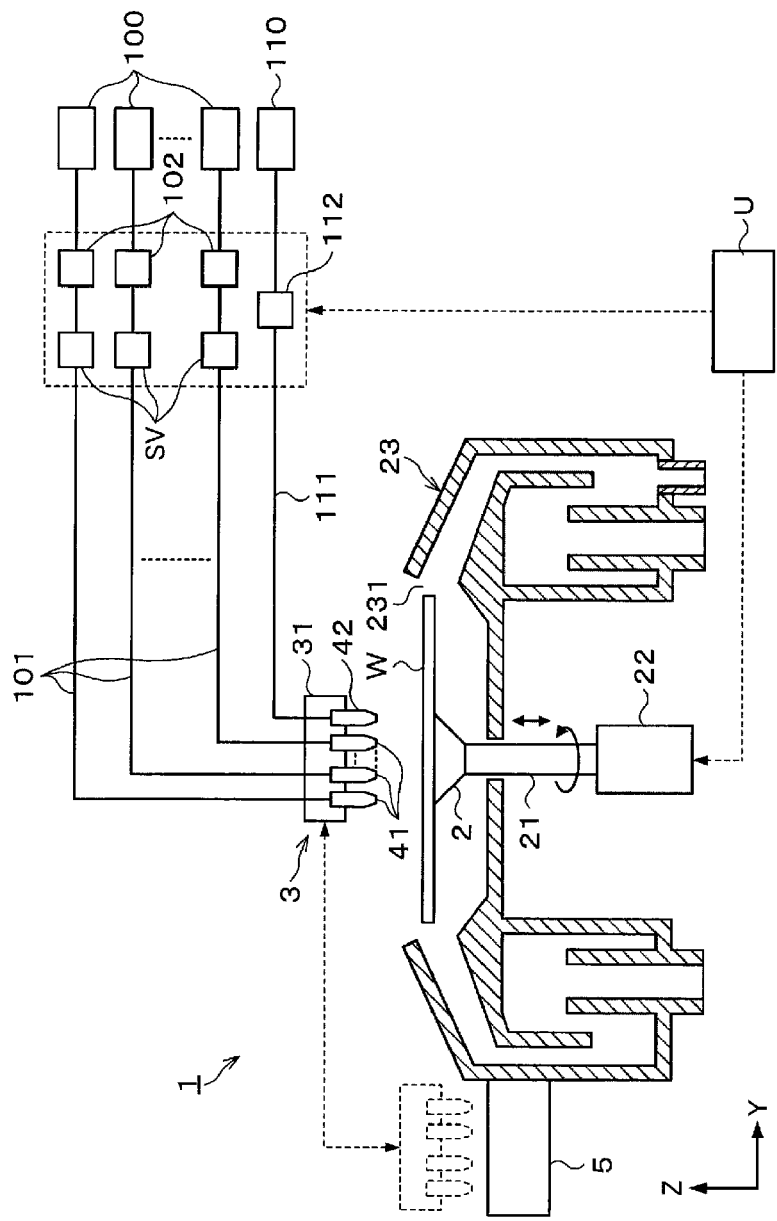
FIG. 1 is a longitudinal side view illustrating a schematic configuration of a liquid processing apparatus equipped with a nozzle standby device according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A manufacturing process for a semiconductor device or the like includes a processing of coating a resist liquid on a substrate to form a resist pattern. In this processing, while rotating a semiconductor wafer (hereinafter, simply referred to as "wafer") held by, for example, a spin chuck, the resist liquid is discharged onto a substantially central portion to the wafer from a nozzle.

The resist liquid includes a component of the resist film, made of an organic material, and a solvent for this component. If the resist liquid comes into contact with the atmosphere, it is highly likely to be dried, and, if the resist liquid is dried, a concentration of the resist liquid or the like may be changed. For the reason, there is adopted a method of suppressing the drying of the resist liquid within the nozzle by forming an air layer and a solvent layer (liquid layer of the solvent) at an outside of the resist liquid layer within a leading end portion of the nozzle when the nozzle is not being used. This method involves performing dummy dispensing of the resist liquid within the nozzle, forming the air layer by suctioning the inside of the nozzle, and suctioning the inside of the nozzle while immersing the leading end portion of the nozzle in the solvent. In this method, the resist liquid attached to an inner wall of the nozzle when the air layer is formed in the leading end portion of the nozzle may be collected to a discharge opening of the nozzle, forming a thin film of the resist liquid at the discharge opening of the nozzle. If the thin film of the resist liquid is formed at the discharge opening of the nozzle, the solvent may be easily introduced into the nozzle when it comes into contact with the thin film of the resist film as the leading end portion of the nozzle is immersed in the solvent.

However, when using a high-viscosity resist liquid such as a resist thin film for a 3D NAND memory, the resist liquid attached to the inner wall of the nozzle is difficult to collect to the discharge opening of the nozzle. Therefore, the thin film of the resist liquid is difficult to form at the discharge opening of the nozzle, as compared to a case where the conventional low-viscosity resist liquid is used. As a result, even if the inside of the nozzle is suctioned while keeping the leading end portion of the nozzle immersed in the solvent, the solvent is difficult to introduce into the nozzle, since the thin film of the resist film is not formed at the discharge opening of the nozzle. That is, in the conventional nozzle standby device, it has been difficult to form a liquid layer of the solvent in the leading end portion of the nozzle when the resist liquid has high viscosity.

In view of the foregoing, the present disclosure provides a technique enabling, in forming the liquid layer of the solvent by sucking the solvent into the leading end portion of the nozzle for discharging the processing liquid when the nozzle stands by in the nozzle accommodation unit, to form the liquid layer of the solvent in the leading end portion of the nozzle even if the processing liquid to be discharged has high viscosity.

Hereinafter, a nozzle standby device and an operation method of a liquid processing apparatus according to an exemplary embodiment will be described with reference to the accompanying drawings. In the present specification and the drawings, parts having substantially same functional configurations will be assigned same reference numerals, and redundant description thereof will be omitted.

Figure 2:
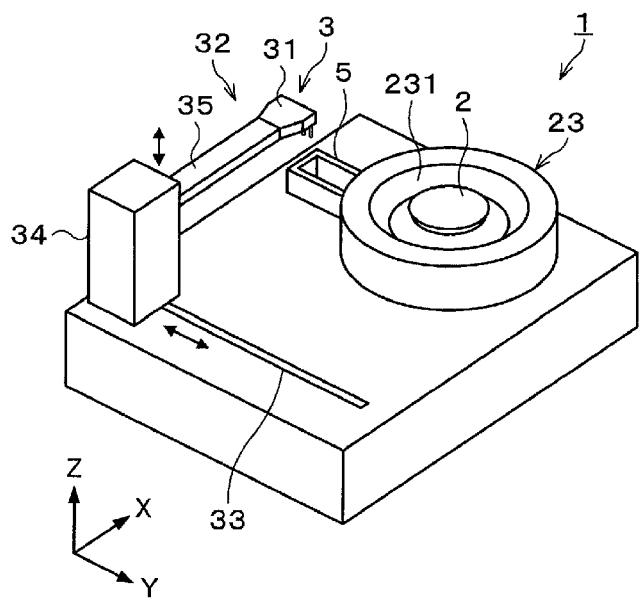
FIG. 2 is a perspective view illustrating the schematic configuration of the liquid processing apparatus equipped with the nozzle standby device according to the exemplary embodiment.
Figure 3:
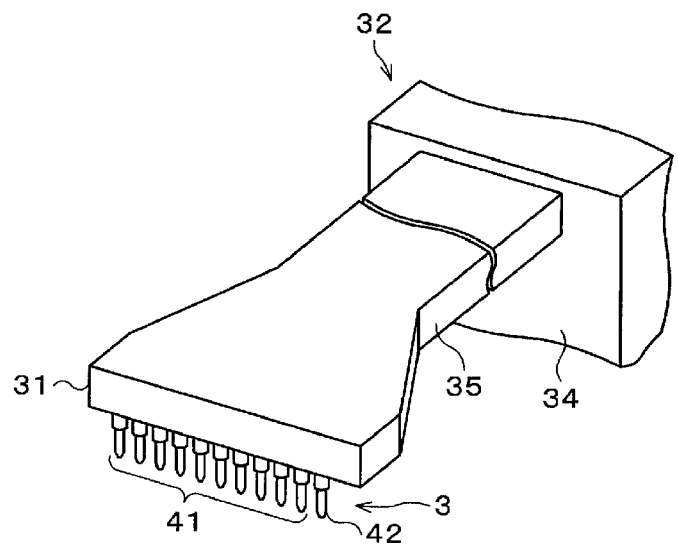
FIG. 3 is a perspective view illustrating a nozzle unit provided in the liquid processing apparatus.
Figure 4:
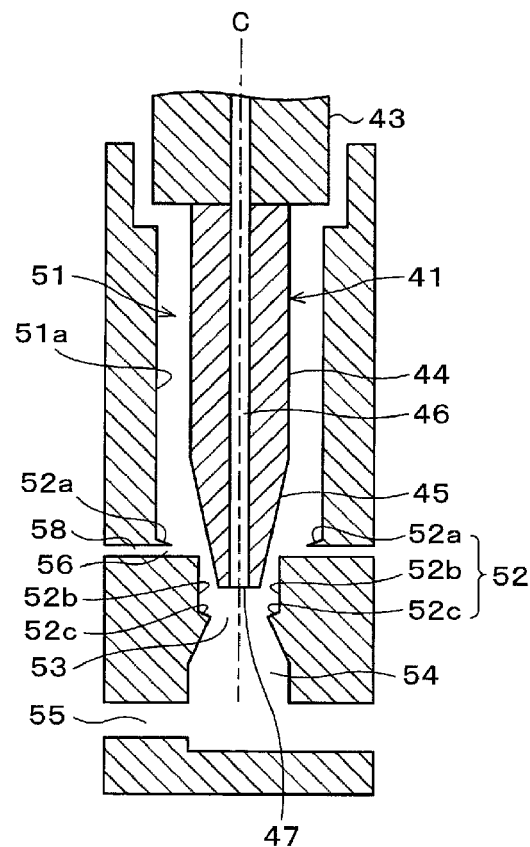
FIG. 4 is a longitudinal side view illustrating a coating nozzle provided in the nozzle unit and a part of a standby unit.
Figure 5:
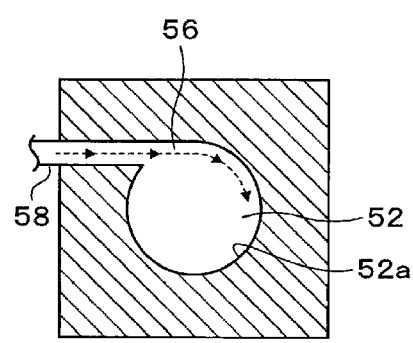
FIG. 5 is a transversal cross sectional view of a nozzle accommodation unit cut to include a solvent discharge opening.
Figure 6:
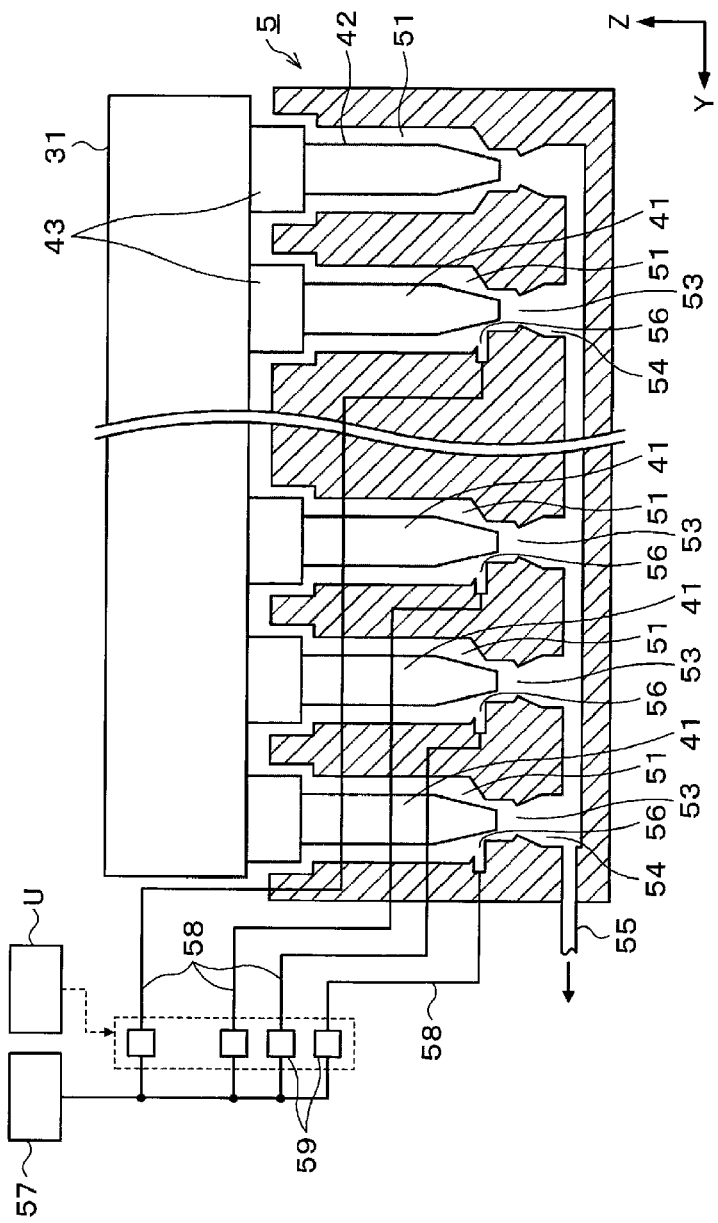
FIG. 6 is a longitudinal side view illustrating the nozzle unit and the standby unit.

FIG. 1 and FIG. 2 are a longitudinal side view and a perspective view, respectively, illustrating a schematic configuration of a liquid processing apparatus 1 equipped with a nozzle standby device according to an exemplary embodiment. FIG. 3 is a perspective view illustrating a nozzle unit provided in the liquid processing apparatus. FIG. 4 is a longitudinal side view illustrating a coating nozzle provided in the nozzle unit and a part of a standby unit. FIG. 5 is a transversal cross sectional view of a nozzle accommodation unit cut to include a solvent discharge opening. FIG. 6 is a longitudinal side view illustrating the nozzle unit and the standby unit.

The liquid processing apparatus 1 is equipped with, as illustrated in FIG. 1 and FIG. 2, a spin chuck 2 as a substrate holder configured to hold a wafer W horizontally by attracting a central portion of a rear surface of the wafer W. This spin chuck 2 is configured to be pivotable around a vertical axis and moved up and down with the wafer W held thereon by a driving mechanism 22, which has an actuator such as a motor, via a driving shaft 21. A cup 23 having a top opening is provided around the spin chuck 2, surrounding the wafer W on the spin chuck 2. The cup 23 receives and collects a liquid scattered or falling from the wafer W.

Further, the liquid processing apparatus 1 is equipped with a nozzle unit 3. The nozzle unit 3 is configured to discharge a coating liquid from a coating nozzle 41 onto a substantially center portion of a front surface of the wafer W held by the spin chuck 2. This nozzle unit 3 includes a plurality of (for example, 10) coating nozzles 41 each configured to discharge a processing liquid; and, for example, one solvent nozzle 42 configured to discharge a solvent for the processing liquid. The coating nozzles 41 and the solvent nozzle 42 are fixed to a support 31 as one body. The processing liquid is of a type which is solidified by being dried. For example, the processing liquid may be a resist liquid having high viscosity (e.g., 50 cp to 1000 cp) for use in the manufacture of a 3D NAND memory. Further, the processing liquid may be a pigment resist (OCCF) or a water-soluble resist. The solvent may be, by way of non-limiting example, water or thinner such as PGMEA or OK73. In the following, the coating nozzles 41 and the solvent nozzle 42 may sometimes be simply referred to as nozzles 41 and 42, respectively.

The coating nozzles 41 and the solvent nozzle 42 are fixed to the support 31 such that they are arranged in a straight line along a transversal direction (Y-axis direction of FIG. 2) of the liquid processing apparatus 1. Each coating nozzle 41 has a base end portion 43 connected to the support 31; a cylindrical portion 44 extending vertically downwards from the base end portion 43; and a leading end portion 45 having a substantially truncated conical shape with a gradually decreasing diameter as it goes downwards from the cylindrical portion 44. A vertically extending path 46 for the processing liquid is formed through the base end portion 43, the cylindrical portion 44 and the leading end portion 45. The path 46 is opened at a leading end side of the nozzle as a discharge opening 47 for the processing liquid. The discharge opening 47 may be formed to have, for example, a circular shape, when viewed from the top. The solvent nozzle 42 has the same configuration as the coating nozzle 41, for example.

The coating nozzles 41 and the solvent nozzle 42 are supported by the common support 31, and configured to be moved by a moving mechanism 32 between a processing position where they supply the processing liquid or the like onto the wafer W on the spin chuck 2 and a standby position where they are accommodated in a standby unit 5 to be described later. By way of example, the moving mechanism 32 is equipped with, as depicted in FIG. 2, a horizontally moving member 34 configured to be moved along a guide 33 extending in the transversal direction (Y-axis direction of FIG. 2); and an arm 35 extending inwards (positive X-axis direction of FIG. 2) from the horizontally moving member 34 and having the support 31 at a leading end thereof. The arm 35 is configured to be moved up and down by an elevating mechanism (not shown) having an actuator such as a cylinder, thus enabling height adjustment of the nozzles 41 and 42.

The respective coating nozzles 41 are connected to different processing liquid sources 100, as shown in FIG. 1, for example. The processing liquid sources 100 store therein, for example, different kinds of resist liquids, or resist liquids of the same kind but having different viscosity. For example, the resist liquid for the resist thin film of the 3D NAND memory is stored as the processing liquid.

Provided at a processing liquid supply path 101 between one coating nozzle 41 and the corresponding processing liquid source 100 are, for example, a suck-back valve SV as a suction device for the solvent and a flow rate controller 102.

The suck-back valve SV is configured to retreat (suck back) a leading end liquid surface of the processing liquid remaining in the path 46 of the coating nozzle 41 toward the corresponding processing liquid source 101 side when the discharge of the processing liquid from the coating nozzle 41 is stopped. The suck-back valve SV is equipped with, for example, a bellows having therein a suction room communicating with the corresponding processing liquid supply path 101, and is configured to suck the processing liquid within the coating nozzle 41 toward the corresponding processing liquid supply path 101 side by expanding the bellows to turn the inside of the suction room into a negative pressure. Further, the suck-back valve SV is provided with a needle. By changing the maximum volume of the suction room with this needle, a distance by which the leading end liquid surface of the processing liquid is retreated can be adjusted.

The flow rate controller 102 is configured to adjust a flow rate of the processing liquid, and is equipped with an opening/closing valve, a mass flow controller, and so forth.

The solvent nozzle 42 is connected to a solvent source 100 in which the solvent is stored. A flow rate controller 112 is provided in a solvent supply path 111 between the solvent nozzle 42 and the solvent source 110. The flow rate controller 112 is configured to adjust a flow rate of the solvent, and is equipped with an opening/closing valve, a mass flow controller, and so forth.

The suck-back valves SV and the flow rate controllers 102 and 112 are controlled by a controller U to be described later.

Further, the liquid processing apparatus 1 is equipped with, as illustrated in FIG. 1 and FIG. 2, the standby unit 5 as a nozzle standby device. The standby unit 5 is provided on an outer surface of the cup 23, for example. The standby unit 5 includes as many nozzle accommodation units 51 as the number (eleven in the shown example) of the nozzles 41 and 42, as shown in FIG. 6, for example. Each of the nozzle accommodation units 51 has a cylindrical shape, and the coating nozzles 41 and the solvent nozzle 42 can be accommodated in the corresponding nozzle accommodation units 51 individually. These nozzle accommodation units 51 are arranged in a straight line along, for example, a transversal direction (Y-axis direction of FIG. 6).

The nozzle accommodation units 51 for the coating nozzles 41 have the same structure, which will be described with reference to FIG. 4. FIG. 4 illustrates the leftmost nozzle accommodation unit 51 in FIG. 6. A portion of this nozzle accommodation unit 51 for accommodating the cylindrical portion 44 and the leading end portion 45 of the corresponding coating nozzle 41 is of, for example, a cylindrical shape, and a lower part of the nozzle accommodation unit 51 is configured as a diameter reducing portion 52 whose inner diameter becomes smaller as it goes downwards, for example. Further, a lower end of the nozzle accommodation unit 51 communicates with, through a drain opening 53, a drain space 54 shared between the nozzle accommodation units 51. A liquid introduced into the drain space 54 is drained to the outside of the liquid processing apparatus 1 through a drain path 55.

When the nozzle unit 3 is located at the standby position where it is accommodated in the standby unit 5, the leading end portion 45 of each of the coating nozzles 41 is located in the corresponding diameter reducing portion 52 of the corresponding nozzle accommodation unit 51, as shown in FIG. 4 and FIG. 6. An inner circumferential surface of the diameter reducing portion 52 corresponds to an inner circumferential surface surrounding the leading end portion of the corresponding coating nozzle 41. Further, the drain opening 53 is located under the discharge opening 47 of the nozzle 41 to face the discharge opening 47. The drain opening 53 has a circular shape when viewed from the top, and has a diameter larger than an outer diameter of a portion of the coating nozzle 41 corresponding to the discharge opening 47 of the coating nozzle 41. For example, a portion with the smallest inner diameter between the diameter reducing portion 52 and the liquid drain space 54 corresponds to the drain opening 53.

Further, a solvent discharge opening 56 through which the solvent is supplied is provided in a lower sidewall (for example, a sidewall of the diameter reducing portion 52) of the nozzle accommodation unit 51 for the coating nozzle 41. The solvent discharge opening 56 is formed to discharge the solvent so that the solvent flows along an inner circumferential surface of the diameter reducing portion 52, for example. To elaborate, the solvent discharge opening 56 is provided in a tangent direction of the diameter reducing portion 52, as shown in FIG. 5, for example. Accordingly, the solvent discharged from the solvent discharge opening 56 is guided along the inner circumferential surface of the nozzle accommodation unit 51 to be drained from the drain opening 53. That is, with the above-described configuration, in the diameter reducing portion 52, the solvent discharged from the solvent discharge opening 56 falls down, forming a swirling flow.

Here, the structure of the diameter reducing portion 52 will be elaborated. The inner circumferential surface of the diameter reducing portion 52 according to the present exemplary embodiment includes, as depicted in FIG. 4, a first inner circumferential surface 52a, a second inner circumferential surface 52b, and a third inner circumferential surface 52c.

The first inner circumferential surface 52a is a surface with a decreasing inner diameter as it goes toward the drain opening 53 from a wall surface of the nozzle accommodation unit 51 facing the cylindrical portion 44 of the coating nozzle 41. The first inner circumferential surface 52a has the same shape as a side surface of a truncated cone, and is formed as a slopped surface with respect to a center line C of the nozzle accommodation unit 51. In the present specification, the center line C of the nozzle accommodation unit 51 refers to a line passing through a center of a circle formed by an inner circumferential surface 51a of the nozzle accommodation unit 51a facing the cylindrical portion 44 of the coating nozzle 41.

The second inner circumferential surface 52b is a surface extending from a lower end of the first inner circumferential surface 52a toward the drain opening 53. In the present exemplary embodiment, an inner diameter of an upper end of the second inner circumferential surface 52b is the same as an inner diameter of a lower end of the first inner circumferential surface 52a, and the second inner circumferential surface 52b maintains this inner diameter as it goes from the inner circumferential surface 52a toward the drain opening 53. That is, the second inner circumferential surface 52b of the present exemplary embodiment extends parallel to the center line C of the nozzle accommodation unit 51 and is not inclined with respect to the center line C. Further, the shape of the second inner circumferential surface 52b may not be limited to the example of the present exemplary embodiment. By way of non-limiting example, the second inner circumferential surface 52b may be inclined with respect to the center line C of the nozzle accommodation unit 51 and have a diameter which decreases as it goes from the lower end of the first inner circumferential surface 52a toward the drain opening 53. That is, the shapes of the first inner circumferential surface 52a and the second inner circumferential surface 52b are not particularly limited as long as they are formed at different angles with respect to the center line C of the nozzle accommodation unit.

Figure 7:
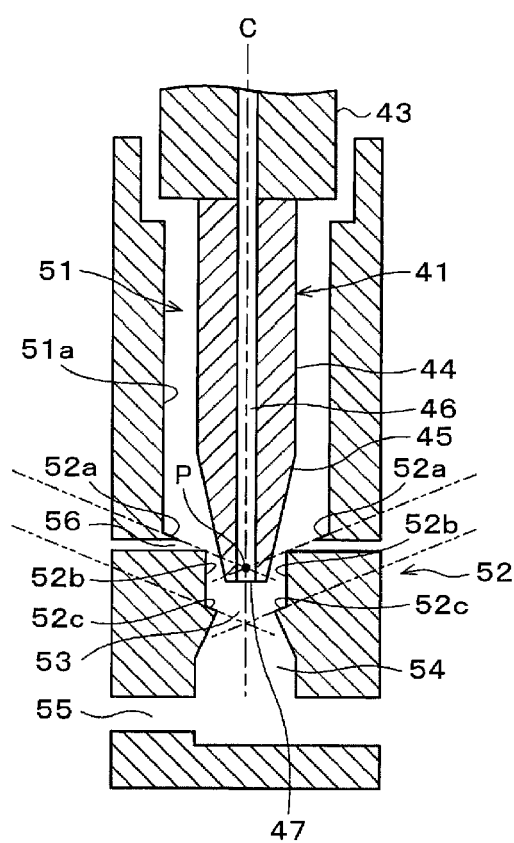
FIG. 7 is a longitudinal side view illustrating the coating nozzle provided in the nozzle unit and a part of the standby unit.

FIG. 7 is the same cross sectional view as FIG. 4, and it illustrates a cross section cut along the center line C of the nozzle accommodation unit 51 to include the center line C. The first inner circumferential surface 52a is formed such that an intersection point P of two straight lines extending along two opposite portions of the first inner circumferential surface 52a shown on the cross section of FIG. 7 is located above the discharge opening 47 of the coating nozzle 41 when the coating nozzle 41 is placed within the diameter reducing portion 52. The first inner circumferential surface 52a inclined with respect to the center line C of the nozzle accommodation unit 51 in this way makes it difficult for the solvent discharged from the solvent discharge opening 56 to be drained as will be described later, thus making it easy for the solvent to be collected into the diameter reducing portion 52 while the solvent is being drained. Further, an angle formed by the two opposite portions of the first inner circumferential surface 52a shown on the cross section cut along the center line C of the nozzle accommodation unit 51 to include the center line C is desirably in a range from 120 degrees to 180 degrees. Furthermore, it is also desirable that the first inner circumferential surface 52a is formed such that the intersection point P is located in a region inside the second inner circumferential surface 52b, as in the present exemplary embodiment. If the first inner circumferential surface 52a is formed such that the intersection point P is located in the region inside the second inner circumferential surface 52b, it is easier to collect the solvent into the diameter reducing portion 52 while the solvent discharged from the solvent discharge opening 56 is being drained through the drain opening 53.

The third inner circumferential surface 52c extends from a lower end of the second inner circumferential surface 52b toward the drain opening 53, and is formed to have an inner diameter which becomes smaller as it goes toward the drain opening 53 from the lower end of the second inner circumferential surface 52b. This third inner circumferential surface 52c impedes a flow of the solvent heading toward the drain opening 53 from the second inner circumferential surface 52b, making it difficult for the solvent discharged from the solvent discharge opening 56 to be drained from the drain opening 53. Accordingly, while the solvent discharged from the solvent discharge opening 56 is being drained from the drain opening 53, it become easier to collect the solvent into the diameter reducing portion 52. Furthermore, the inner circumferential surface of the diameter reducing portion 52 may not include the third inner circumferential surface 52c. However, in order to collect the solvent into the diameter reducing portion 52 easily as stated above, it is desirable to provide the third inner circumferential surface 52c. In addition, if the third inner circumferential surface 52c is formed, it is desirable that the angle formed by the two opposite portions of the first inner circumferential surface 52a and an angle formed by two opposite portions of the third inner circumferential surface 52c shown on the cross section cut along the center line C of the nozzle accommodation unit 51 to include the center line C are equal. With this configuration, it becomes easier to collect the solvent into the diameter reducing portion 52 while draining the solvent once discharged from the solvent discharge opening 56 from the drain opening 53. Moreover, if the third inner circumferential surface 52c is not formed, it is desirable that the second inner circumferential surface 52b is formed to have an inner diameter which becomes smaller as it goes from the lower end of the first inner circumferential surface 52a toward the drain opening 53.

As illustrated in FIG. 6, each solvent discharge opening 56 is connected to a solvent source 57 in which the solvent is stored. Flow rate controllers 59 are respectively provided in solvent supply paths 58 between the solvent discharge openings 56 and the solvent source 57. The flow rate controller 59 is configured to adjust a flow rate of the solvent discharged from the corresponding solvent discharge opening 56, and is equipped with an opening/closing valve, a mass flow controller, and so forth. Each flow rate controller 59 is controlled by the controller U to be described later. A solvent supply unit including the solvent source 57, the solvent supply path 58, and the flow rate controller 59 supplies the solvent into the solvent discharge opening 56 to allow the solvent to be discharged from the solvent discharge opening 56 at a preset flow rate when a liquid layer of the solvent is formed within the coating nozzle 41.

Further, the nozzle accommodation unit 51 corresponding to the solvent nozzle 42 has the same configuration as the nozzle accommodation units 51 corresponding to the coating nozzles 41 except that the solvent discharge opening 56, for example, is not formed therein.

The coating nozzles 41 and the solvent nozzle 42 of the nozzle unit 3 are arranged on, for example, a straight line passing through a rotation center of the wafer W, and the nozzle accommodation units 51 of the standby unit 5 are also arranged on the straight line passing through the rotation center of the wafer W.

The liquid processing apparatus 1 configured as described above is equipped with the controller U. The controller U may be, for example, a computer including a CPU, a memory, and so forth, and has a program storage (not shown). The program storage stores therein a program for controlling the suck-back valves SV, the flow rate controllers 102, 112 and 59, and so forth to control a wafer processing to be described later. Further, the program may be recorded on a computer-readable recording medium and installed from the recording medium to the controller U. A part or the whole of the program may be implemented by dedicated hardware (circuit board).

Figure 8:
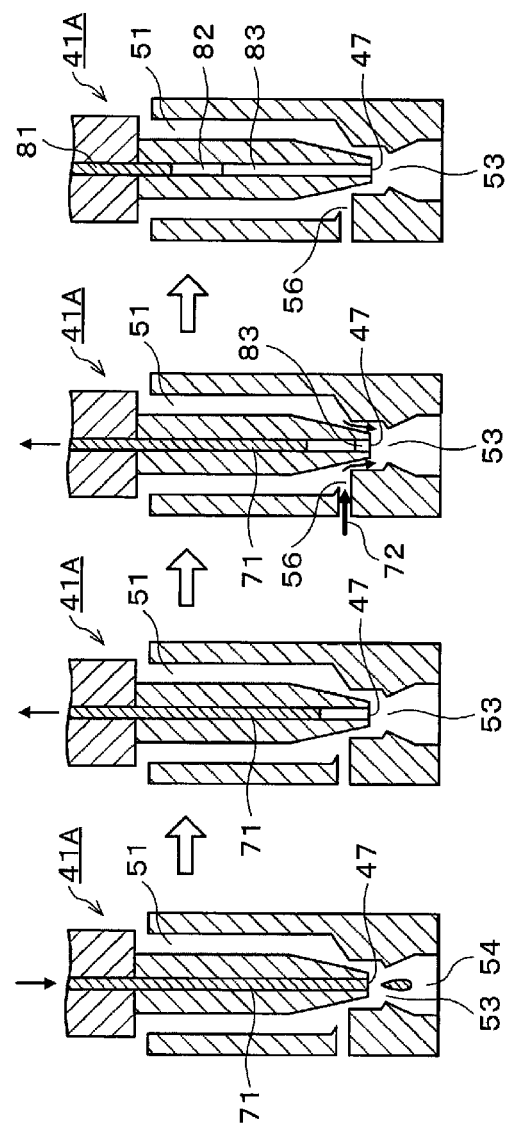
FIG. 8A to FIG. 8D are longitudinal side views illustrating an operation of the liquid processing apparatus.
Figure 9:
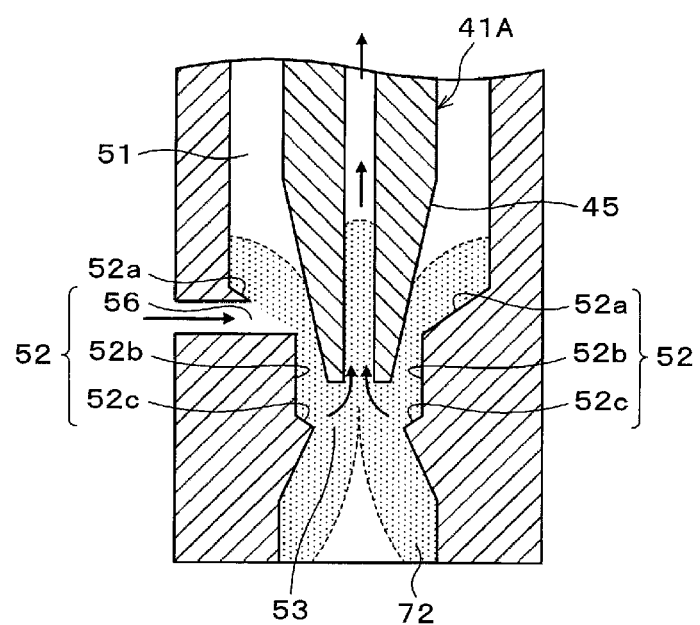
FIG. 9 is a longitudinal side view illustrating the operation of the liquid processing apparatus.
Figure 10:
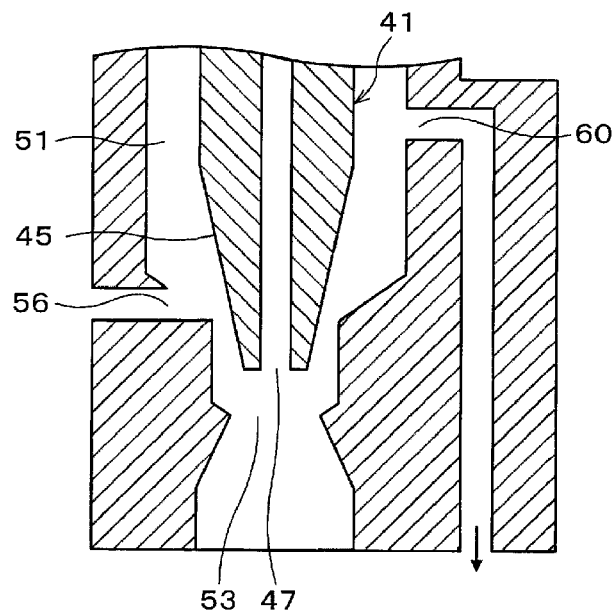
FIG. 10 shows an example where a solvent drain opening different from a drain opening is provided in the nozzle accommodation unit.

Now, with reference to FIG. 8A to FIG. 9, the wafer processing using the liquid processing apparatus 1 will be described for an example where a coating processing of the resist liquid is performed by using one coating nozzle 41 (hereinafter, referred to as "coating nozzle 41A") of the nozzle unit 3.

First, a pre-wet processing of discharging the solvent onto the front surface of the wafer W held by the spin chuck 2 from the solvent nozzle 42 is performed. To elaborate, the spin chuck 2 is raised to above the cup 23, and the wafer W is delivered onto the spin chuck 2 from a wafer transfer device (not shown). Subsequently, the nozzle unit 3 is moved to a position where the solvent nozzle 42 supplies the solvent onto the rotation center of the wafer W held by the spin chuck 2, and the thinner as the solvent is supplied. Then, the wafer W is rotated by the spin chuck 2, and the thinner is diffused to a peripheral portion of the wafer W by a centrifugal force.

Thereafter, a coating processing is performed by discharging a resist liquid having viscosity of, e.g., 50 cp to 1000 cp from the coating nozzle 41A onto the front surface of the wafer W held by the spin chuck 2. To elaborate, after the pre-wet processing, the rotation of the spin chuck 2 is stopped, and the nozzle unit 3 is moved to a position where the coating nozzle 41A supplies the resist liquid onto the rotation center of the wafer W held by the spin chuck 2, and the resist liquid is discharged. Then, the wafer W is rotated by the spin chuck 2, and the resist liquid is diffused to the peripheral portion of the wafer W from the central portion thereof by the centrifugal force. The wafer W coated with the resist liquid is then delivered to the wafer transfer device.

Meanwhile, if the discharge of the coating liquid is not performed for more than a preset time after the completion of this coating processing, the nozzle unit 3 is moved to a position where it faces the standby unit 5, and is then lowered to accommodate the leading end portions of the respective coating nozzles 41 in the corresponding nozzle accommodation units 51, thus locating the coating nozzles 41 at the standby positions. In this state, a resist liquid 71 within a leading end of the path 46 of the coating nozzle 41A is discharged into the nozzle accommodation unit 51 by the dummy dispensing (see FIG. 8A). The resist liquid 71 is drained to the drain space 54 through the drain opening 53 of the nozzle accommodation unit 51.

Subsequently, a first suction is performed by the suck-back valve SV provided in the processing liquid supply path 101 of the coating nozzle 41A. Accordingly, a liquid surface of the resist liquid 71 within the path 46 of the coating nozzle 41A is retreated toward the processing liquid supply path 101 side to rise from the leading end of the coating nozzle 41A, as shown in FIG. 8B. For example, the liquid surface of the resist liquid 71 within the coating nozzle 41A rises about 1 mm to about 3 mm from the leading end of the coating nozzle 41A.

Then, as illustrated in FIG. 8C, a second suction is performed by the suck-back valve SV, and by discharging a solvent 72 into the nozzle accommodation unit 51 from the solvent discharge opening 56 at a preset flow rate, a liquid layer of the solvent (solvent layer 83) is formed in a leading end portion of the path 46 of the coating nozzle 41A. The solvent 72 discharged from the solvent discharge opening 56 flows along the inner circumferential surface of the diameter reducing portion 52 of the nozzle accommodation unit 51, falls down as the swirling flow, and is then drained from the drain opening 53.

While the solvent 72 is being dropped in a spiral shape after being guided along the inner circumferential surface of the nozzle accommodation unit 51 as stated above, the solvent 72 is difficult to drain from the drain opening 53 since the first inner circumferential surface 52a is formed such that the aforementioned intersection point P (see FIG. 7) is located above the discharge opening 47 of the coating nozzle 41A. Accordingly, it becomes easy for the solvent 72 to be collected in the diameter reducing portion 52 temporarily. If the resist liquid 71 has the high viscosity, a thin film of the resist liquid 71, which contributes to the formation of the solvent layer 83, is difficult to form at the discharge opening 57 of the coating nozzle 41A. According to the standby unit 5 of the present exemplary embodiment, however, the solvent 72 is easily collected into the diameter reducing portion 52. Therefore, the discharge opening 47 of the coating nozzle 41A located in the diameter reducing portion 52 can be kept closed by the solvent 72 which is gathered in the diameter reducing portion 52 temporarily. Thus, even if the thin film of the resist liquid 71 is not formed at the discharge opening 47 of the coating nozzle 41A, the solvent 72 may be easily introduced into the path 46. Accordingly, even if the resist liquid has the high viscosity, it is possible to form the solvent layer 83 in the path 46 of the coating nozzle 41A. Meanwhile, in the conventional standby unit, since the aforementioned intersection point P is located under the second inner circumferential surface 52b, the solvent 72 is difficult to collect into the diameter reducing portion 52. That is, the solvent 72 may be easily drained from the drain opening 53, making it difficult to maintain the discharge opening 47 of the coating nozzle 41A closed by the solvent 72. As a result, in the conventional standby unit, it has been difficult to form the solvent layer 83 unless the thin film of the resist liquid 71 is formed at the leading end of the coating nozzle 41A.

As stated above, a processing liquid layer 81, an air layer 82 and the solvent layer 83 are formed within the path 46 of the coating nozzle 41A in sequence from the processing liquid supply path 101 side, as illustrated in FIG. 8D. Accordingly, since the processing liquid (resist liquid) within the leading end of the coating nozzle 41A is blocked from the atmosphere by the air layer 82 and the solvent layer 83, the drying of the processing liquid can be suppressed.

By way of example, the suction by the suck-back valve SV is carried out such that the liquid surface of the solvent layer 83 within the coating nozzle 41A rises about 5 mm to 15 mm from the leading end of the coating nozzle 41A. Further, in the state that the discharge of the solvent 72 from the solvent discharge opening 56 is stopped, the path 46 within the coating nozzle 41A may be suctioned by the suck-back valve SV to additionally form an air layer (not shown) outside the solvent layer 83 within the leading end of the coating nozzle 41A. By additionally forming the air layer at a leading end side outer than the solvent layer 83 within the coating nozzle 41A in this way, sucking of droplets of the solvent 72 into the leading end of the coating nozzle 41A can be suppressed.

In the state that the solvent layer 83 or the like is formed as stated above, the respective coating nozzles 41 stand by at the standby positions within the standby unit 5.

Now, the coating processing performed on the wafer W in the liquid processing apparatus 1 by using the nozzle unit 3 in which the processing liquid layer 81, the air layer 82 and the solvent layer 83 are formed in the leading end of each coating nozzle 41 will be described for an example where one coating nozzle 41A of the nozzle unit 3 is used.

First, a processing of expelling the solvent layer 83 from the coating nozzle 41A is performed. That is, the coating nozzle 41A is placed at the standby position in the standby unit 5, and a preset amount of the resist liquid 71 is discharged from the nozzle 41A to expel the solvent layer 83 in the leading end of the nozzle 41A. Then, the sucking-back of the resist liquid 71 is performed. At this time, to reduce the waste amount of the resist liquid 71, a supply amount of the resist liquid 71 for expelling only the solvent layer 83 may be previously calculated by experiment. For example, by lowering the liquid surface of the resist liquid 71 by, e.g., about 2 mm, the solvent layer 83 may be expelled.

Afterwards, the nozzle unit 3 is moved to a processing position where the coating nozzle 41A supplies the coating liquid to the wafer W, and the resist liquid is supplied onto the wafer W from the coating nozzle 41A so that the coating processing is performed in the same way as described above. Then, if the discharge of the coating liquid is not performed for more than a preset time after the completion of the coating processing, the used coating nozzle 41A is accommodated back into the nozzle accommodation unit 51 of the standby unit 5, and the processing liquid layer 81, the air layer 82 and the solvent layer 83 are formed within the coating nozzle 41A in sequence from the processing liquid supply path 101 side, as described above.

Thereafter, when a coating processing is performed by using another coating nozzle 41 (hereinafter, referred to as "coating nozzle 41B") different from the aforementioned coating nozzle 41A, the solvent layer 83 of the coating nozzle 41B is expelled, the same as in the case of the coating nozzle 41A. Then, after the coating processing of the resist liquid as the processing liquid is performed on the wafer W by using this coating nozzle 41B, the nozzle unit 3 is placed at the standby position of the standby unit 5, and the processing of forming the processing liquid layer 81, the air layer 82, and the solvent layer 83 within the leading end of this coating nozzle 41B is performed.

Further, the processing of expelling the solvent of the coating nozzle 41A to be used, the subsequent preset coating processing, the subsequent processing of forming the processing liquid layer 81, the air layer 82 and the solvent layer 83 within the leading end of the coating nozzle 41A, and the subsequent coating processing using another coating nozzle 41B or the like are performed based on the program stored in the controller U.

As stated above, the standby unit 5 configured as the nozzle standby device according to the present exemplary embodiment is equipped with the nozzle accommodation units 51 and the solvent discharge openings 56. Each nozzle accommodation unit 51 has the diameter reducing portion 52 having the first inner circumferential surface 52a and the second inner circumferential surface 52b so that the inner diameter thereof decreases as it goes toward the drain opening 53. Further, on the cross section cut along the center line C of the nozzle accommodation unit 51 to include the center line C, the intersection point P of the two straight lines respectively extending along the two opposite portions of the first inner circumferential surface 52a is located above the discharge opening 47 of the coating nozzle 41 when the leading end portion 45 of the coating nozzle 41 is placed in the diameter reducing portion 52. With this standby unit 5, it is easy to collect the solvent into the diameter reducing portion 52 when the solvent discharged from the solvent discharge opening 56 is drained from the drain opening 53. Accordingly, the solvent can be easily introduced into the path 46 of the coating nozzle 41. Thus, according to the standby unit 5 of the present exemplary embodiment, in forming the liquid layer of the solvent by standing-by the coating nozzle 41 for discharging the resist liquid 71 in the nozzle accommodation unit 51 and sucking the solvent into the leading end portion 45 of the coating nozzle 41, it is possible to form the liquid layer of the solvent in the leading end portion 45 of the coating nozzle 41 even if the resist liquid 71 to be discharged has high viscosity.

Further, since the solvent 72 is easily collected into the diameter reducing portion 52 in the standby unit 5 according to the present exemplary embodiment, there is a concern that the solvent may be collected into the nozzle accommodation unit 51 excessively if the supply of the solvent 72 from the solvent discharge opening 56 is continued. As a resolution, it may be desirable to provide a solvent drain opening 60 different from the drain opening 53 in a region above the solvent discharge opening 56 to drain the surplus of the solvent. The solvent drain opening 60 is connected to the drain path 55 (see FIG. 6) into which the processing liquid and the solvent drained from the drain opening 53 flows, and is drained to the outside of the liquid processing apparatus 1 through the drain path 55. If the solvent drain opening 60 is provided as described above, the solvent 72 excessively collected and thus overflown from the nozzle accommodation unit 51 is drained from the nozzle accommodation unit 51, so that the rise of the liquid surface of the solvent 72 can be suppressed. Accordingly, the adhesion of the solvent 72 to the side surface of the coating nozzle 41 can be suppressed.

Figure 11:
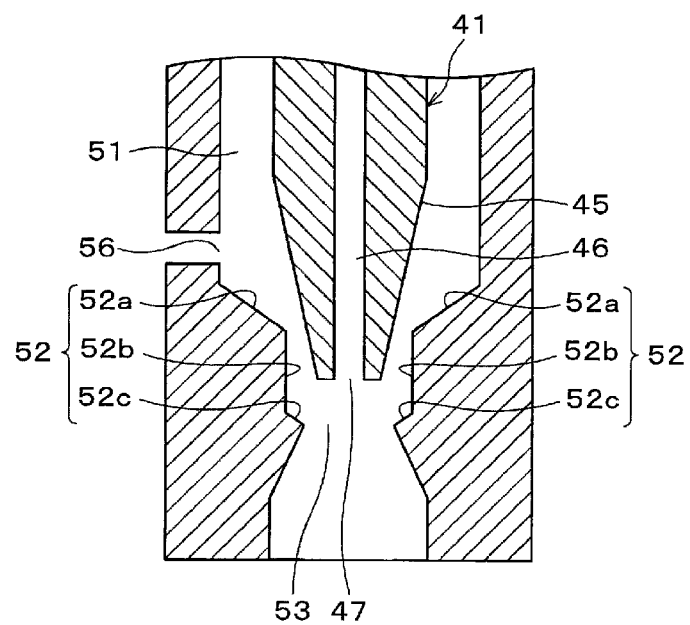
FIG. 11 is a diagram illustrating an example position where the solvent discharge opening is formed.

Although the solvent discharge opening 56 is formed in the first inner circumferential surface 52a in the above-described exemplary embodiment, the location of the solvent discharge opening 56 is not particularly limited as long as the solvent can fall down, forming the swirling flow as shown in FIG. 5. By way of example, the solvent discharge opening 56 may be formed above the first inner circumferential surface 52a, that is, above the diameter reducing portion 52, as illustrated in FIG. 11. If the solvent discharge opening 56 is located above the diameter reducing portion 52, the range where the swirling flow is formed can be enlarged in the vertical direction (Z-axis direction), so that the swirling flow can be easily maintained until the solvent is drained from the drain opening 53. Accordingly, when forming the liquid layer of the solvent by sucking the solvent from the leading end portion 45 of the coating nozzle 41, the solvent can be easily collected into the diameter reducing portion 52, making it easy to form the liquid layer of the solvent in the path 46 of the coating nozzle 41.

Further, in the above-described exemplary embodiment, when performing preliminary discharging in which the processing liquid is discharged before forming the liquid layer of the solvent by sucking the solvent into the leading end portion 45 of the coating nozzle 41, as shown in FIG. 8A, only the processing liquid (the resist liquid 71 in the example of FIG. 8A) is discharged. Meanwhile, if the processing liquid has high viscosity, the processing liquid is difficult to drain from the drain opening 53, and the processing liquid may adhere to the wall surface within the nozzle accommodation unit 51, resulting in clogging of the nozzle accommodation unit 51. If such clogging occurs, the leading end portion 45 of the coating nozzle 41 standing by in the nozzle accommodation unit 51 may be contaminated. As a resolution, when performing the aforementioned preliminary discharging, it is desirable to perform the discharging of the processing liquid from the coating nozzle 41 and the discharging of the solvent from the solvent discharge opening 56 at the same time. Since the processing liquid of the high viscosity can be diluted by the solvent, the draining of the processing liquid from the drain opening 53 can be accelerated.

Figure 12:
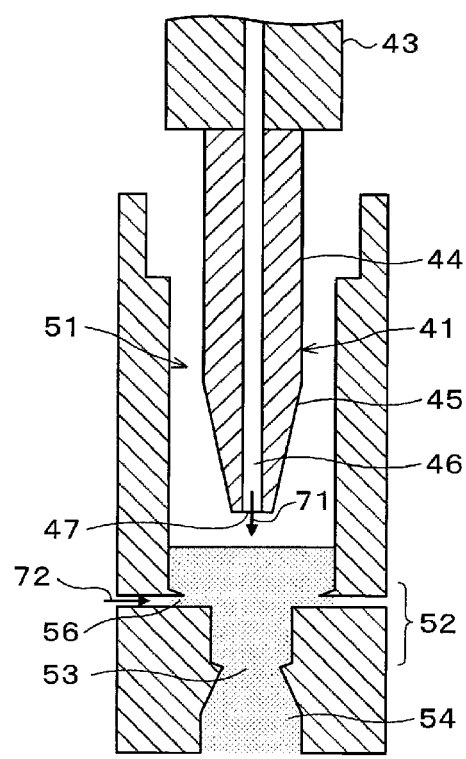
FIG. 12 is a diagram illustrating example placement of the coating nozzle when preliminary discharging is performed.

Furthermore, in the above-described exemplary embodiment, the nozzle unit 3 is configured to be moved between the processing position and the standby position. However, it is more desirable that the nozzle unit 3 is configured to be moved between the processing position, the standby position, and a preliminary discharging standby position. The preliminary discharging standby position refers to a position where the leading end portion 45 of each coating nozzle 41 is accommodated in the corresponding nozzle accommodation unit 51 in the state that the discharge opening 47 of the coating nozzle 41 is located higher than the solvent discharge opening 56. In the present example, the controller U, for example, may perform a control of moving the coating nozzle 41 such that the leading end portion 45 of the coating nozzle 41 is located above the solvent discharge opening 56. When performing the preliminary discharging, it is desirable that the nozzle unit 3 is being moved to the aforementioned preliminary discharging standby position. Accordingly, the processing liquid (the resist liquid 71 in the example of FIG. 12) diluted by the solvent 72 does not adhere to the coating nozzle 41, so that the contamination of the leading end portion 45 of the coating nozzle 41 can be suppressed.

Moreover, the above exemplary embodiment has been described for the example where the nozzle unit 3 has the plurality of coating nozzles 41. However, the number of the coating nozzles 41 is not limited thereto, and the present exemplary embodiment may be applicable to a configuration where the nozzle unit 3 has a single coating nozzle. In addition, the nozzle standby device according to the present disclosure may also be applicable to a liquid processing apparatus for a processing target substrate other than the semiconductor wafer, for example, a FPD (Flat Panel Display) substrate.

It should be noted that the exemplary embodiment is illustrative in all aspects and is not anyway limiting. The above-described exemplary embodiment may be omitted, replaced and modified in various ways without departing from the scope and the spirit of claims.

According to the exemplary embodiment, in forming the liquid layer of the solvent by sucking the solvent into the leading end portion of the nozzle for discharging the processing liquid when the nozzle stands by in the nozzle accommodation unit, it is possible to form the liquid layer of the solvent in the leading end portion of the nozzle even if the processing liquid to be discharged has high viscosity.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A nozzle standby device configured to allow a nozzle configured to discharge a processing liquid, which is to be solidified by being dried, to stand by therein, the nozzle standby device comprising:

a nozzle accommodation unit, having an inner circumferential surface formed to surround a leading end portion of the nozzle, provided with a drain opening facing a discharge opening of the nozzle; and a solvent discharge opening formed within a height range of the inner circumferential surface of the nozzle accommodation unit, and formed such that a discharged solvent is guided along the inner circumferential surface of the nozzle accommodation unit to be drained from the drain opening, wherein the nozzle accommodation unit has, in a region above the drain opening where the solvent discharged from the solvent discharge opening falls down as a swirling flow, a diameter reducing portion having a first inner circumferential surface and a second inner circumferential surface as the inner circumferential surface such that an inner diameter of the diameter reducing portion becomes smaller toward the drain opening, the first inner circumferential surface and the second inner circumferential surface having different angles with respect to a center line of the nozzle accommodation unit, and an intersection point of two straight lines extending along two opposite portions of the first inner circumferential surface is located, on a cross section cut along the center line of the nozzle accommodation unit to include the center line, above the discharge opening of the nozzle when the leading end portion of the nozzle is placed in the diameter reducing portion, wherein the solvent discharge opening is formed above the diameter reducing portion or within a height range of the first inner circumferential surface.

2. The nozzle standby device of claim 1,
wherein the intersection point is located in a region inside the second inner circumferential surface.

3. The nozzle standby device of claim 1,
wherein the diameter reducing portion has a third inner circumferential surface formed such that the inner diameter thereof decreases toward the drain opening from the second inner circumferential surface.

4. The nozzle standby device of claim 3,
wherein, on the cross section cut along the center line of the nozzle accommodation unit to include the center line, an angle formed by the two opposite portions of the first inner circumferential surface and an angle formed by two opposite portions of the third inner circumferential surface are equal.

5. The nozzle standby device of claim 1,
wherein a solvent drain opening different from the drain opening is formed above the solvent discharge opening of the nozzle accommodation unit.

6. The nozzle standby device of claim 1, further comprising:

a controller configured to perform a control in which discharging of the processing liquid from the nozzle and discharging of the solvent from the solvent discharge opening are performed at a same time in the nozzle accommodation unit when performing preliminary discharging in which the processing liquid is discharged before forming a liquid layer of the solvent by sucking the solvent into the leading end portion of the nozzle.

7. The nozzle standby device of claim 6,
wherein the controller is configured to perform a control in which the nozzle is moved such that the leading end portion of the nozzle is located above the solvent discharge opening when the preliminary discharging is performed.

8. A liquid processing apparatus, comprising:
a substrate holder configured to hold a substrate;
a nozzle configured to discharge a processing liquid, which is to be solidified by being dried, onto a front surface of the substrate held by the substrate holder;
a nozzle standby device as claimed in claim 1; and
a suction device configured to suction a path within the nozzle, which stands by in the nozzle standby device, to suck a solvent upwards.

9. An operation method of a liquid processing apparatus, comprising:
discharging a processing liquid, which is to be solidified by being dried, from a nozzle onto a front surface of a substrate held by a substrate holder;
allowing the nozzle to stand by in a nozzle accommodation unit having an inner circumferential surface formed to surround a leading end portion of the nozzle, the nozzle accommodation unit being provided with a drain opening facing a discharge opening of the nozzle;
draining the processing liquid from the drain opening facing the discharge opening by discharging the processing liquid from the discharge opening of the nozzle which stands by in the nozzle accommodation unit; and
forming a liquid layer of a solvent within the nozzle with the solvent by discharging the solvent from a solvent discharge opening formed within a height range of the inner circumferential surface of the nozzle accommodation unit so that the discharged solvent is guided along the inner circumferential surface of the nozzle accommodation unit,
wherein the nozzle accommodation unit has, in a region above the drain opening where the solvent discharged from the solvent discharge opening falls down as a swirling flow, a diameter reducing portion having a first inner circumferential surface and a second inner circumferential surface as the inner circumferential surface such that an inner diameter of the diameter reducing portion becomes smaller toward the drain opening, the first inner circumferential surface and the second inner circumferential surface having different angles with respect to a center line of the nozzle accommodation unit, and
in the forming of the liquid layer of the solvent, the nozzle is disposed such that an intersection point of two straight lines extending along two opposite portions of the first inner circumferential surface is located above the discharge opening of the nozzle on a cross section cut along the center line of the nozzle accommodation unit to include the center line,
wherein the solvent discharge opening is formed above the diameter reducing portion or within a height range of the first inner circumferential surface.

10. The operation method of the liquid processing apparatus of claim 9,
wherein, in the forming of the liquid layer of the solvent, the nozzle is disposed such that the intersection point is located in a region inside the second inner circumferential surface.

11. The operation method of the liquid processing apparatus of claim 9,
wherein, in the forming of the liquid layer of the solvent, a flow of the solvent is impeded between the second inner circumferential surface and the drain opening.

12. The operation method of the liquid processing apparatus of claim 11,
wherein the diameter reducing portion has a third inner circumferential surface formed such that the inner diameter thereof decreases toward the drain opening from the second inner circumferential surface, and
on the cross section cut along the center line of the nozzle accommodation unit to include the center line, an angle formed by the two opposite portions of the first inner circumferential surface and an angle formed by two opposite portions of the third inner circumferential surface are equal.

13. The operation method of the liquid processing apparatus of claim 9,
wherein the solvent collected into the nozzle accommodation unit excessively is drained from a portion above the solvent discharge opening of the nozzle accommodation unit.

14. The operation method of the liquid processing apparatus of claim 9,
wherein, in the draining of the processing liquid, discharging of the processing liquid from the nozzle and discharging of the solvent from the solvent discharge opening are performed at a same time.

15. The operation method of the liquid processing apparatus of claim 14,
wherein, in the draining of the processing liquid, the leading end portion of the nozzle does not come into contact with the processing liquid discharged from the nozzle and the solvent discharged from the solvent discharge opening, which are collected in the diameter reducing portion.

* * * * *